United States Patent

Utsuno et al.

(10) Patent No.: US 8,143,664 B2
(45) Date of Patent: Mar. 27, 2012

(54) SEMICONDUCTOR DEVICE HAVING LOWER LEAKAGE CURRENT BETWEEN SEMICONDUCTOR SUBSTRATE AND BIT LINES

(75) Inventors: Yukihiro Utsuno, Fukushima-ken (JP); Namjin Heo, Fukushima-ken (JP)

(73) Assignee: Spansion LLC, Sunnyvale, CA (US)

( * ) Notice: Subject to any disclaimer, the term of this patent is extended or adjusted under 35 U.S.C. 154(b) by 451 days.

(21) Appl. No.: 11/712,299

(22) Filed: Feb. 27, 2007

(65) Prior Publication Data

US 2007/0210373 A1 Sep. 13, 2007

Related U.S. Application Data

(63) Continuation-in-part of application No. PCT/JP2006/303702, filed on Feb. 28, 2006.

(51) Int. Cl.
*H01L 29/792* (2006.01)

(52) U.S. Cl. .......................... 257/315; 257/297; 257/314

(58) Field of Classification Search .................. 257/315, 257/297, 300
See application file for complete search history.

(56) References Cited

U.S. PATENT DOCUMENTS

| 6,103,572 | A | * | 8/2000 | Kirihara | 438/257 |
| 6,979,856 | B2 | * | 12/2005 | Nishizaka et al. | 257/314 |
| 2006/0163642 | A1 | * | 7/2006 | Widdershoven et al. | 257/315 |
| 2007/0105308 | A1 | * | 5/2007 | Hosaka et al. | 438/257 |

FOREIGN PATENT DOCUMENTS

| JP | 10284627 | 10/1998 |
| JP | 2004095893 | 3/2004 |

* cited by examiner

*Primary Examiner* — Wael Fahmy
*Assistant Examiner* — Tifney Skyles

(57) ABSTRACT

A semiconductor device includes a bit line that is provided in a semiconductor substrate, a silicide layer that has side faces and a bottom face surrounded by the bit line and is provided within the bit line, an ONO film that is provided on the semiconductor substrate, and sidewalls that are in contact with the side faces of a trapping layer in the ONO film over the portions of the bit line located on both sides of the silicide layer, the sidewalls being formed with silicon oxide films including phosphorus.

16 Claims, 14 Drawing Sheets

SEMICONDUCTOR DEVICE HAVING LOWER LEAKAGE CURRENT BETWEEN SEMICONDUCTOR SUBSTRATE AND BIT LINES

CROSS-REFERENCES TO RELATED APPLICATIONS

This is a continuation-in-part of International Application No. PCT/JP2006/303702, filed Feb. 28, 2006 which was not published in English under PCT Article 21(2).

BACKGROUND OF THE INVENTION

1. Field of the Invention The present invention generally relates to a semiconductor device and a method of manufacturing the semiconductor device, and more particularly, to a semiconductor device that has bit lines formed in a semiconductor substrate and a method of manufacturing the semiconductor device.

2. Description of the Related Art

In recent years, non-volatile memories that are data-rewritable semiconductor devices are often used. In a flash memory, which is a typical non-volatile memory, each transistor forming a memory cell has a floating gate or an insulating film called a charge accumulating layer. As charges are accumulated in the charge accumulating layer, data is stored. An example of a flash memory having an insulating film as a charge accumulating layer is a SONOS (Silicon Oxide Nitride Oxide Silicon) flash memory that accumulates charges in the trapping layer in an ONO (Oxide/Nitride/Oxide) film. As a SONOS flash memory, U.S. Pat. No. 6,011,725 discloses a flash memory having virtual ground memory cells. Each of the virtual ground memory cells replaces the source and the drain with each other, and operates them in a symmetrical fashion.

FIG. 1 is a plan view of a memory cell of a conventional flash memory. It should be noted that an ONO film is not shown in FIG. 1. Bit lines 12 are formed with diffusion layers buried in a semiconductor substrate 10 extend in the vertical direction of FIG. 1, and word lines 23 extend in the width direction of the bit lines 12. Contact portions 42 are provided for each of the bit lines 12 at intervals of every several word lines 23 (every eight or sixteen word lines 23, for example). The contact portions 42 connect to wiring layers that are formed on the bit lines 12 and extend in the same direction as the bit lines 12.

Since the bit lines 12 are formed with diffusion layers, the resistivity of the bit lines 12 is high. If the bit lines 12 have high resistance, the write and erase characteristics of the charges (or data) accumulated in the trapping layer in the ONO film deteriorate. Therefore, the bit lines 12 are connected to the wiring layers formed with metal layers via the contact portions 42. In this manner, the resistance of the bit lines 12 can be made lower, and deterioration of the write and erase characteristics can be restrained.

As described above, a large number of contact portions 42 connecting to the bit lines 12 are provided, so as to obtain more uniform write and erase characteristics. However, the contact portions 42 add to the area. Therefore, the upper face of each of the bit lines 12 is silicided, so as to form a silicide layer 22a, as shown in FIG. 2A. Referring to FIG. 2A, an ONO film 20 formed with a tunnel oxide film 14, a trapping layer 16, and a top oxide film 18 is formed on the semiconductor substrate 10. Openings for forming the bit lines 12 are formed in the ONO film 20. With the openings serving as masks, the bit lines 12 and the silicide layers 22a are formed.

In this manner, the resistance of the bit lines 12 can be made lower, and uniform write and erase characteristics can be obtained without a large number of contact portions 42. It should be understood here that, in this specification, "the resistance of the bit lines" is the resistance of the bit lines 12 and the silicide layers 22.

However, in a case where the silicide layers 22a are in contact with any portion of the semiconductor substrate 10 other than the bit lines 12, as shown in FIG. 2A, a current flows between the p-type semiconductor substrate 10 and the n-type bit lines 12 via the silicide layers 22a. Japanese Patent Application Publication No. 2005-57187 discloses a technique by which silicide layers 22b in the bit lines 12 are not in contact with the semiconductor substrate 10, as shown in FIG. 2B. By the technique disclosed in Japanese Patent Application Publication No. 2005-57187, the leakage current between the semiconductor substrate 10 and the bit lines 12 can be restrained, and accordingly, the resistance of the bit lines can be made lower.

Japanese Patent Application No. 10-284627 discloses a technique by which silicon oxide films including phosphorus (P) are formed on both sides of a gate insulating film.

However, in the flash memory disclosed in Japanese Patent Application Publication No. 2005-57187, the trapping layer 16 in the ONO film 20 is contaminated by the slurry that is used for polishing the interlayer insulating film and the metal material of the contact portions 42. When the trapping layer 16 is contaminated by organic matters such as Na and K included in the slurry, the charges accumulated in the trapping layer 16 are lost (the charge loss).

SUMMARY OF THE INVENTION

The present invention has been made in view of the above-described circumstances and it is an object of the present invention to provide a semiconductor device that has lower leakage current between the semiconductor substrate and the bit lines, so as to reduce the resistance of the bit lines and restrain the charge loss through the trapping layer, and to provide a method of manufacturing the semiconductor device.

According to a first aspect of the present invention, there is provided a semiconductor device including: a bit line that is provided in a semiconductor substrate; a silicide layer that has side faces and a bottom face surrounded by the bit line, and is provided within the bit line; an ONO film that is provided on the semiconductor substrate; and sidewalls that are in contact with side faces of a trapping layer in the ONO film over portions of the bit line located on both sides of the silicide layer, the sidewalls being formed with silicon oxide films including phosphorus. In accordance with this embodiment, the silicide layer is not in contact with the semiconductor substrate. Accordingly, the leakage current between the semiconductor substrate and the bit line can be restrained, and the resistance of the bit line can be made lower. Also, the silicon oxide films including phosphorus getter the contaminants in the trapping layer, so as to restrain the charge loss.

According to a second aspect of the present invention, there is provided a method of manufacturing a semiconductor device including: forming a trapping layer on a semiconductor substrate; forming an opening in the trapping layer; forming a bit line in a portion of the opening located within the semiconductor substrate; forming sidewalls on side faces of the opening, the side walls being formed with oxide silicon films including phosphorus; and forming a silicide layer in the bit line, with the sidewalls serving as masks. In accordance with this embodiment, the silicide layer is not in contact with the semiconductor substrate, as the sidewalls serve as masks when the silicide layer is formed. Accordingly, leakage current between the semiconductor substrate and the bit line can be restrained, and the resistance of the bit line can be made lower. Also, the sidewalls having the silicon oxide films including phosphorus getter the contaminants in the trapping layer, so as to restrain the charge loss.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

First Embodiment

Figure 1:
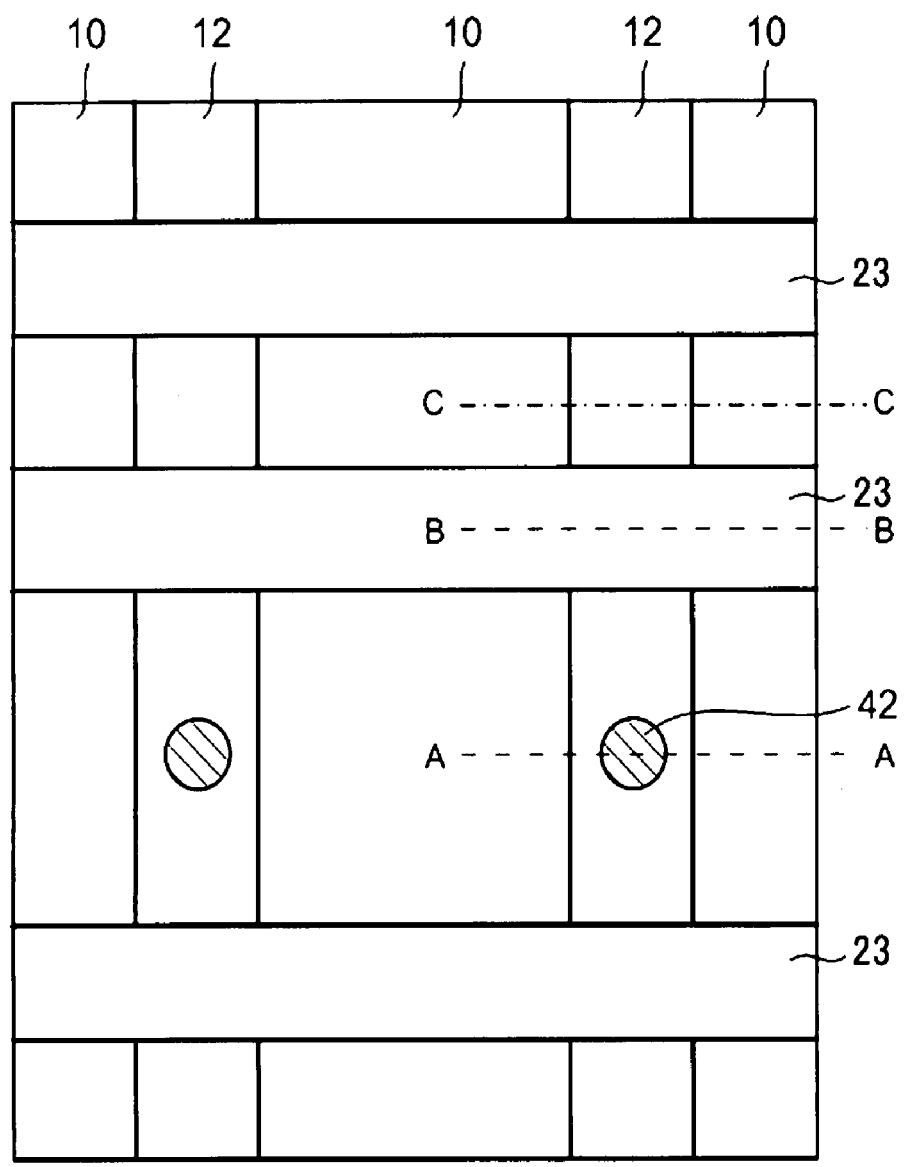
FIG. 1 is a top view of a conventional flash memory.
Figure 2A:
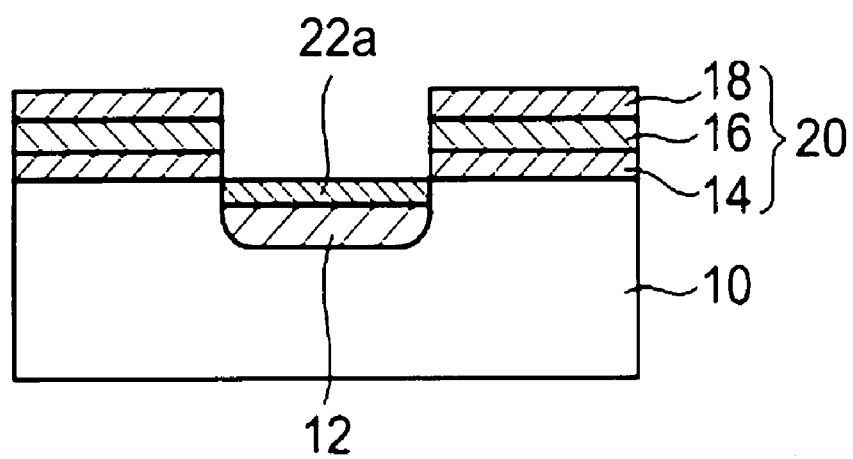
FIGS. 2A and 2B illustrate the problems with the conventional flash memory.
Figure 2B:
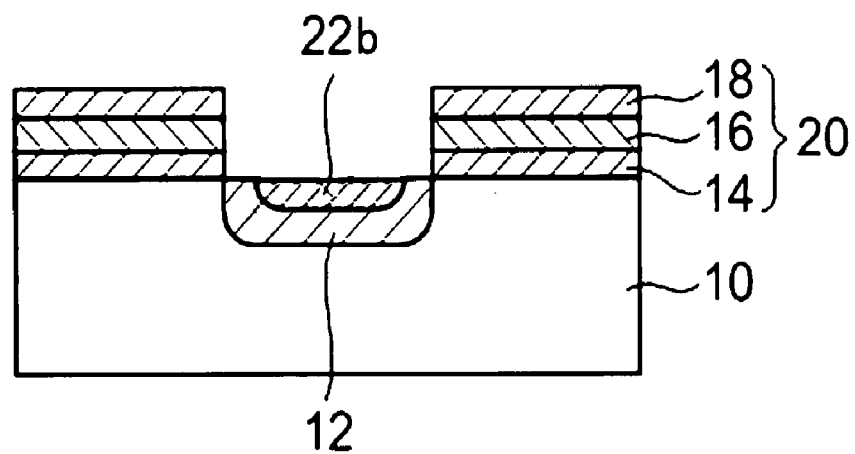
Figure 3A:
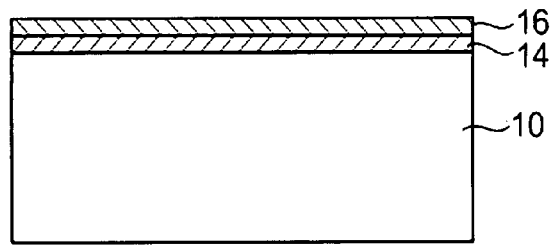
FIGS. 3A through 3D are cross-sectional views showing procedures for manufacturing a flash memory in accordance with a first embodiment of the present invention.
Figure 3B:
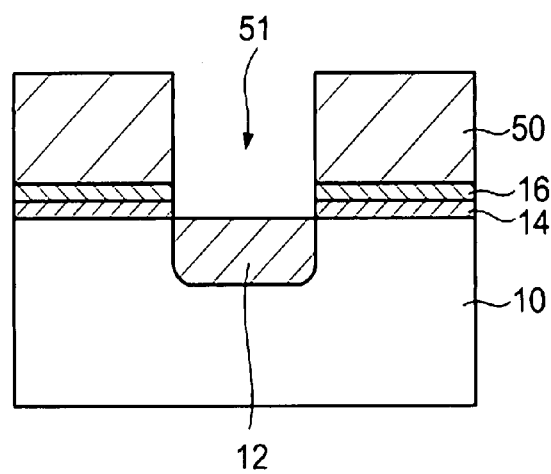
Figure 4A:
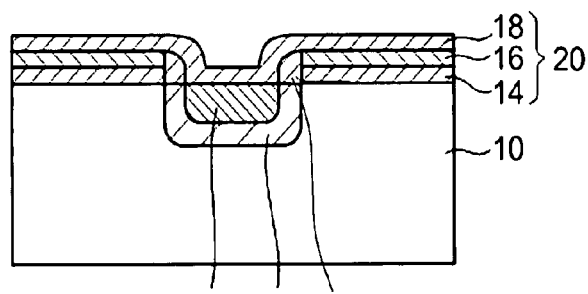
FIGS. 4A through 4D are cross-sectional views also showing procedures for manufacturing the flash memory in accordance with the first embodiment.
Figure 4B:
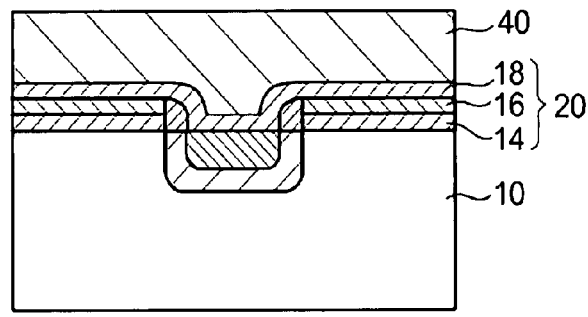
Figure 4C:
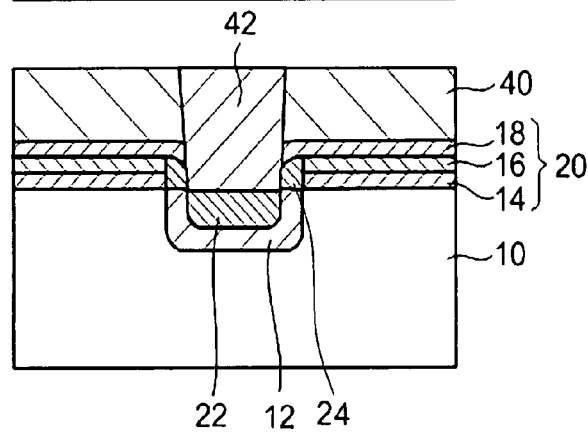
Figure 4D:
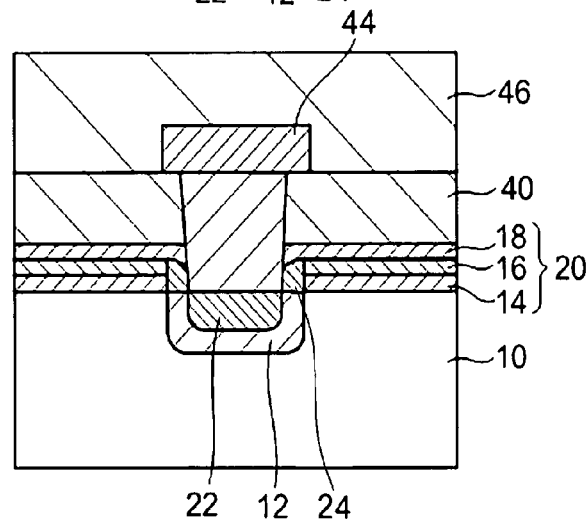
Figure 5A:
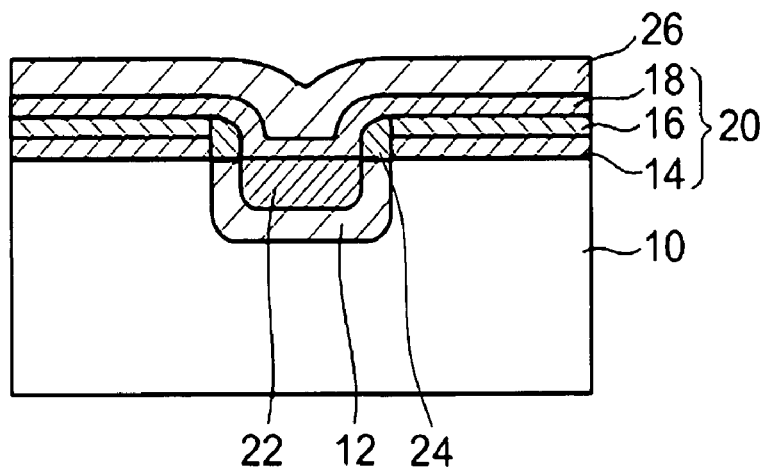
FIGS. 5A and 5B are cross-sectional views also showing procedures for manufacturing the flash memory in accordance with the first embodiment.
Figure 5B:
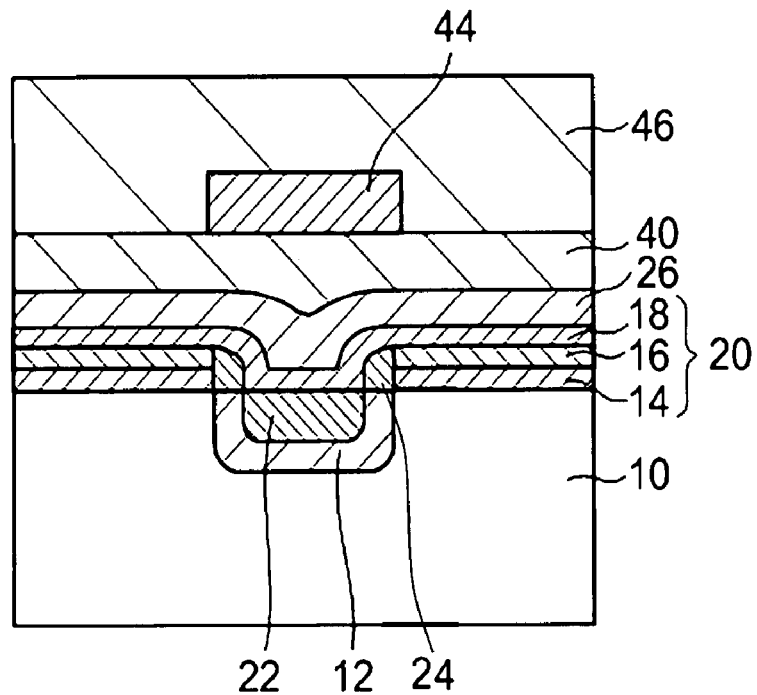
Figure 6:
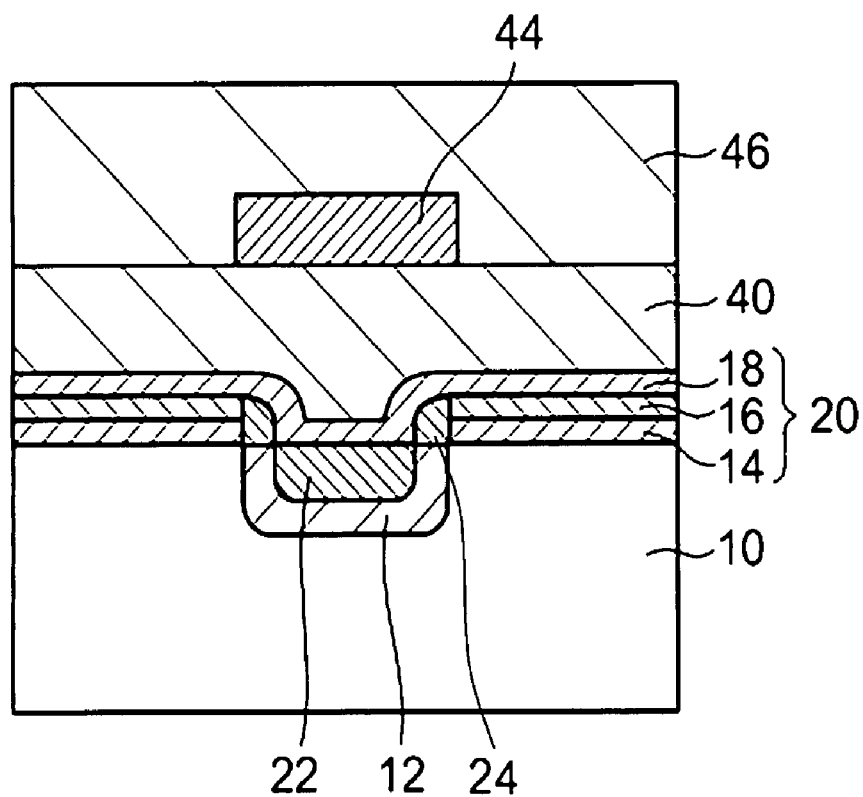
FIG. 6 is a cross-sectional view showing a procedure for manufacturing the flash memory in accordance with the first embodiment.

A first embodiment of the present invention is an example case where word lines also serving as gates are formed. Referring to FIGS. 3A through 6, a method of manufacturing a flash memory in accordance with the first embodiment is described. FIGS. 3A and 4A are cross-sectional views, taken along the lines equivalent to the lines A-A, B-B, and C-C of FIG. 1. FIG. 4B is a cross-sectional view, taken along the lines equivalent to the lines A-A and C-C of FIG. 1. FIGS. 4C and 4D are cross-sectional views, taken along the line equivalent to the line A-A of FIG. 1. FIGS. 5A and 5B are cross-sectional views, taken along the line equivalent to the line B-B of FIG. 1. FIG. 6 is a cross-sectional view, taken along the line equivalent to the line C-C of FIG. 1.

As shown in FIG. 3A, a tunnel oxide film 14 that is a silicon oxide film is formed on a p-type silicon semiconductor substrate (or a p-type well in a semiconductor substrate) 10 by a thermal oxidation method, for example. A trapping layer 16 of a silicon nitride film is then formed on the tunnel oxide film 14 by CVD. As shown in FIG. 3B, a photoresist 50 is formed on the trapping layer 16. Openings 51 for forming bit lines are then formed in the photoresist 50. The openings 51 extend in the direction in which the bit lines should extend. With the photoresist 50 serving as a mask, etching is performed on the trapping layer 16 and the tunnel oxide film 14. In this manner, the openings 51 are formed in the trapping layer 16 and the tunnel oxide film 14. With the photoresist 50 serving as a mask, arsenic (As) ions are implanted, for example. In this manner, bit lines 12 are formed in the respective openings 51 of the semiconductor substrate 10. After the photoresist 50 is removed, a heat treatment is carried out, so that the bit lines 12 formed with n-type diffusion layers are formed in the semiconductor substrate 10.

Figure 3C:
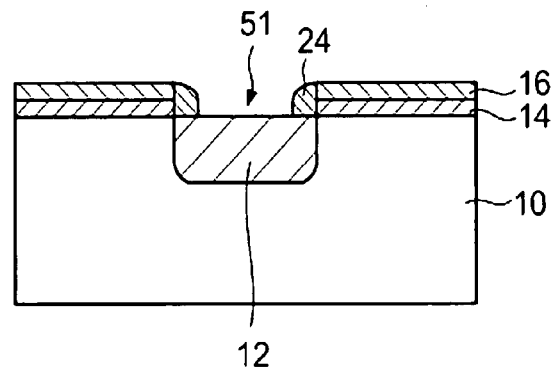
Figure 3D:
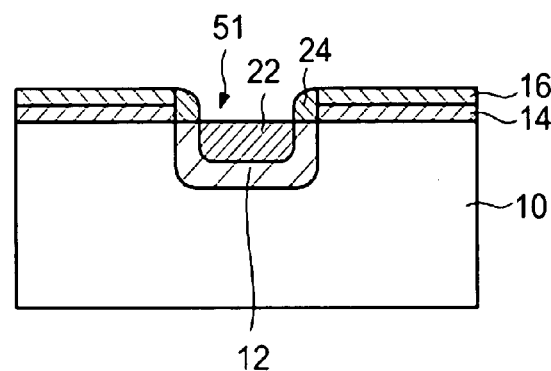

Referring now to FIG. 3C, a PSG (phosphosilicate glass) film that is a silicon oxide film including phosphorus (P) is then formed on the bit lines 12 and the trapping layer 16 by CVD, for example. Etching is then performed on the surface such that sidewalls 24 made of PSG are formed on the side faces of the trapping layer 16 and the tunnel oxide film 14 (or the side faces of the opening 51). A cobalt (Co) film is then formed on the trapping layer 16, the sidewalls 24, and the bit lines 12 by a sputtering technique. After that, a heat treatment is carried out, so that the Co on each of the bit lines 12 is silicided to form a silicide layer 22 made of CoSi (cobalt silicide). The Co on the trapping layer 16 and the sidewalls 24 is not silicided and is removed later. The silicide layers 22 extend within the respective bit lines 12 in the direction in which the bit lines 12 extend. The silicide layers 22 may be made of another silicide metal such as TiSi (titanium silicide).

Referring now to FIG. 4A, a top oxide film 18 such as a silicon oxide film is formed on the trapping layer 16, the sidewalls 24, and the silicide layers 22 by CVD, for example. In this manner, an ONO film 20 formed with the top oxide film 18, the trapping layer 16, and the tunnel oxide film 14 is produced on the semiconductor substrate 10. Referring now to FIG. 5A, a polysilicon film is formed as a conductive layer to be word lines on the top oxide film 18. Etching is performed on predetermined regions of the polysilicon film, so as to form word lines 26 extending in the width direction of the bit lines 12.

Referring now to FIG. 4B, a BPSG (borophosphosilicate glass) film is formed on the top oxide film 18 and the word lines 26. After that, flattening is performed by CMP, so as to form an interlayer insulating film 40. Referring to FIG. 4C, contact holes connecting to the respective silicide layers 22 are formed in the interlayer insulating film 40. A metal layer made of tungsten (W), for example, is formed in each of the contact holes and on the interlayer insulating film 40. Polishing is then performed by CMP, so as to form contact portions 42 that are made of W, for example, and electrically connect to the respective silicide layers 22. Referring to FIG. 4D, wiring layers 44 connecting to the respective contact portions 42 are formed on the interlayer insulating film 40. A protection film 46 is formed to cover the wiring layers 44. Referring to FIG. 5B, the interlayer insulating film 40 is formed on the word lines 26, while the wiring layers 44 and the protection film 46 are formed on the interlayer insulating film 40. Referring to FIG. 6, the interlayer insulating film 40 is formed on the top oxide film 18 between the word lines 26 on which the contact portions 42 are not formed, while the wiring layer 44 and the protection film 46 are formed on the interlayer insulating film 40. In this manner, the flash memory in accordance with the first embodiment is produced.

In accordance with the first embodiment, as shown in FIGS. 4D, 5B, and 6, the bit lines 12 are formed in the semiconductor substrate 10, and the silicide layers 22 that have side faces and a bottom face surrounded by the bit lines 12 and extend in the direction in which the bit lines 12 (the longitudinal direction of the bit lines 12) are formed successively. Furthermore, the ONO film 20 is formed on the semiconductor substrate 10, and the sidewalls 24 formed with silicon oxide films including P are provided on the bit lines 12 on both sides of the respective silicide layers 22. The sidewalls 24 are in contact with the side faces of the trapping layer 16 in the ONO film 20. Since the side faces and the bottom face of each of the silicide layers 22 are surrounded by the bit lines 12 in this structure, current flow between the semiconductor substrate 10 and the bit lines 12 via the silicide layers 22 can be restrained. Accordingly, the silicide layers 22 successively provided in the extending direction of the bit lines can lower the resistance of the bit lines. Further, the sidewalls 24 formed with insulating films are formed on the side faces of the trapping layer 16. The P in the silicon oxide films getters the Na and K in the trapping layer 16. Accordingly, even if the trapping layer 16 is contaminated with organic matters such as Na and K included in the slurry used for the polishing of the interlayer insulating film 40 and the contact portion 42, the amount of Na and K in the trapping layer 16 can be reduced. Thus, the charge loss due to the contamination can be restrained.

Further, the sidewalls 24 are in contact with the side faces of the tunnel oxide film 14 and the trapping layer 16 in the ONO film 20. The top oxide film 18 in the ONO film 20 is provided on the trapping layer 16, the sidewalls 24, and the silicide layers 22. Since the sidewalls 24 are covered with the top oxide film 18, contamination of the trapping layer 16 can be restrained when the interlayer insulating film 40 and the contact portions 42 are polished. Thus, the charge loss can be further reduced. Also, as the word lines 26 are formed on the ONO film 20 as shown in FIG. 5B, the silicide layers 22 can be insulated from the word lines 26 by the top oxide film 18.

Further, the interlayer insulating film 40 is provided on the ONO film 20, and the contact portions 42 connecting to the silicide layer 22 are provided in the interlayer insulating film 40. When the interlayer insulating film 40 and the contact portions 42 are polished, contamination of the trapping layer 16 due to the organic matters such as Na and K included in the slurry used for the polishing can be restrained.

Second Embodiment

Figure 9A:
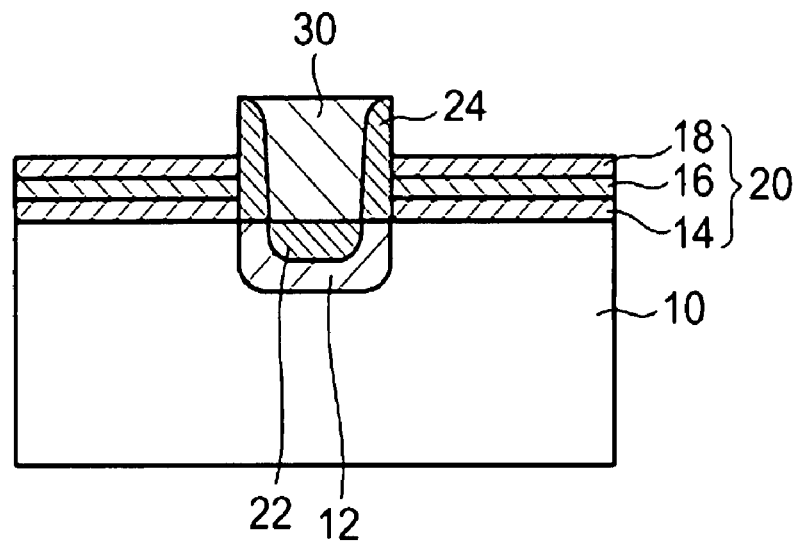
FIGS. 9A and 9B are cross-sectional views also showing procedures for manufacturing the flash memory in accordance with the second embodiment of the present invention.
Figure 9B:
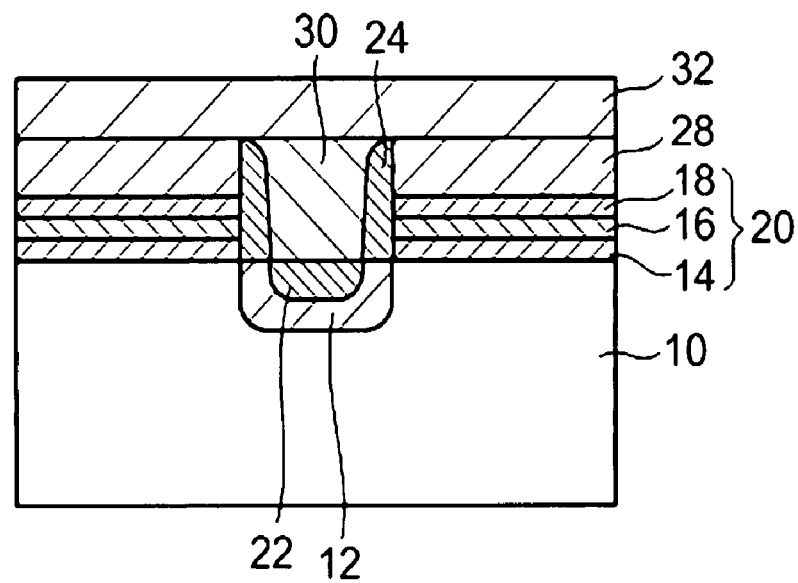
Figure 10A:
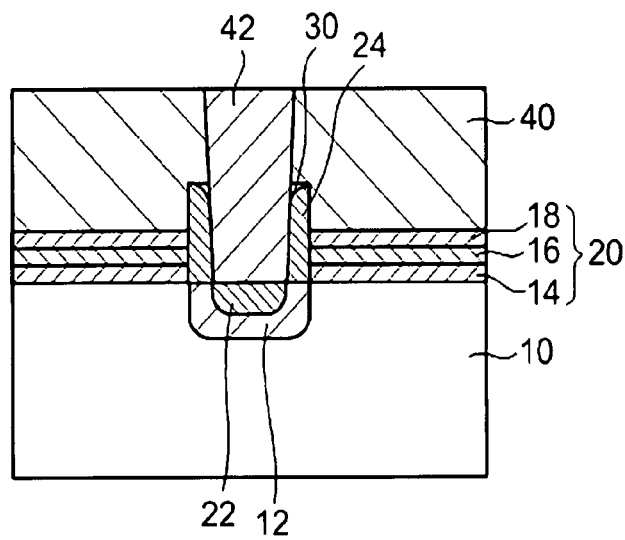
FIGS. 10A through 10C are cross-sectional views also showing procedures for manufacturing the flash memory in accordance with the second embodiment of the present invention.
Figure 10B:
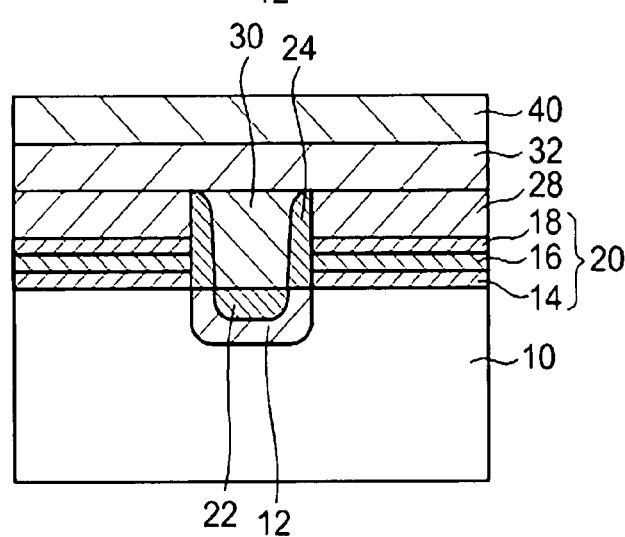
Figure 10C:
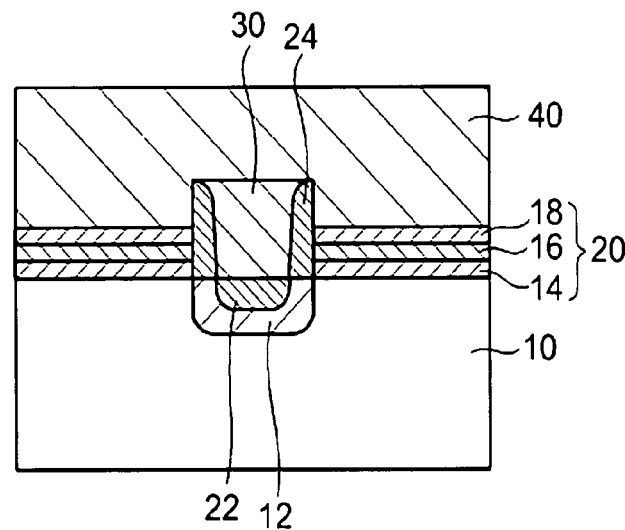
Figure 11A:
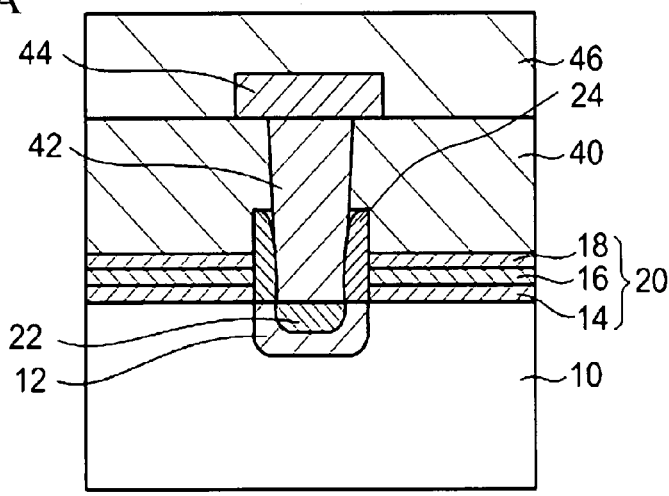
FIGS. 11A through 11C are cross-sectional views also showing procedures for manufacturing the flash memory in accordance with the second embodiment of the present invention.
Figure 11B:
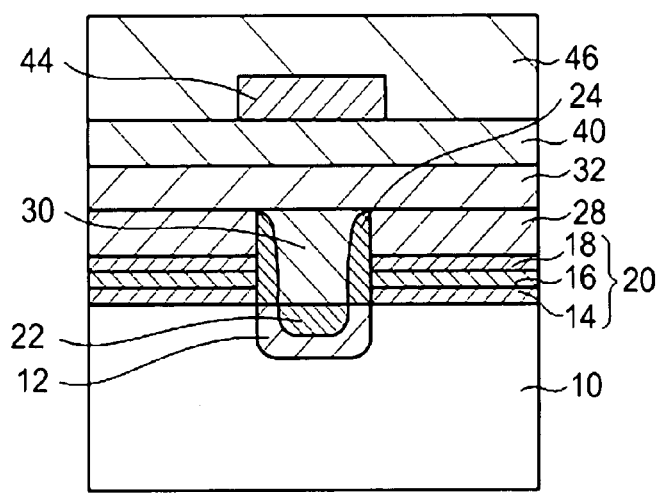
Figure 11C:
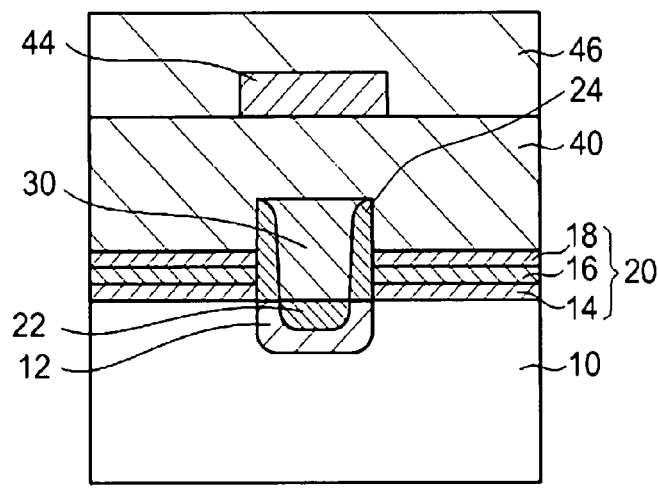

A second embodiment of the present invention is an example case where word lines are formed on gate electrodes. Referring to FIGS. 7A through 11C, a method of manufacturing a flash memory in accordance with the second embodiment is described. FIGS. 7A through 8D are cross-sectional views, taken along the lines equivalent to the lines A-A, B-B, and C-C of FIG. 1. FIG. 9A is a cross-sectional view, taken along the lines equivalent to the lines A-A and C-C of FIG. 1. FIGS. 10A and 11A are cross-sectional views, taken along the line equivalent to the line A-A of FIG. 1. FIGS. 9B, 10B, and 11B are cross-sectional views, taken along the line equivalent to the line B-B of FIG. 1. FIGS. 10C and 11C are cross-sectional views, taken along the line equivalent to the line C-C of FIG. 1.

Figure 7A:
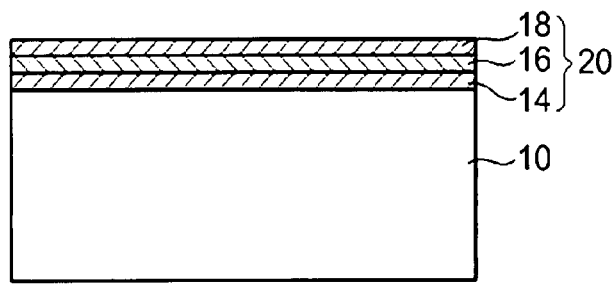
FIGS. 7A through 7D are cross-sectional views showing procedures for manufacturing a flash memory in accordance with a second embodiment of the present invention.
Figure 7B:
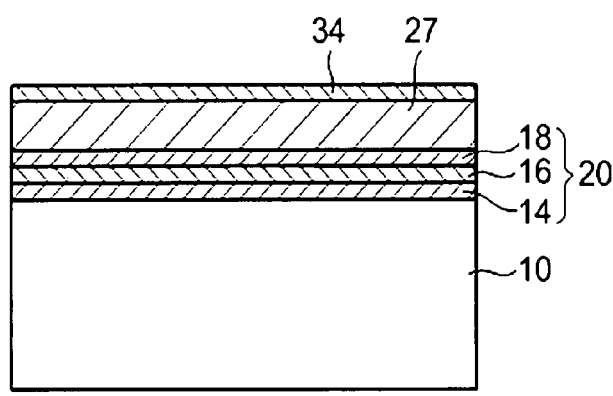
Figure 7C:
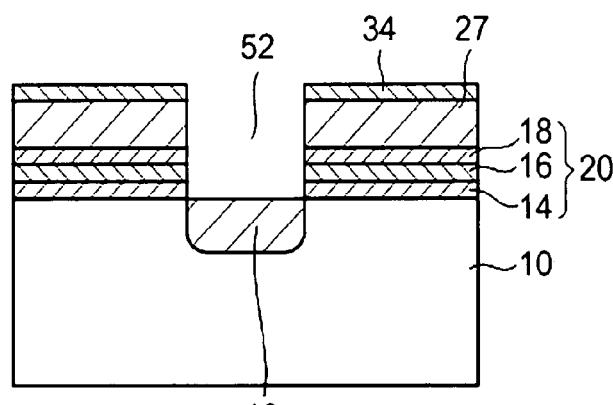
Figure 7D:
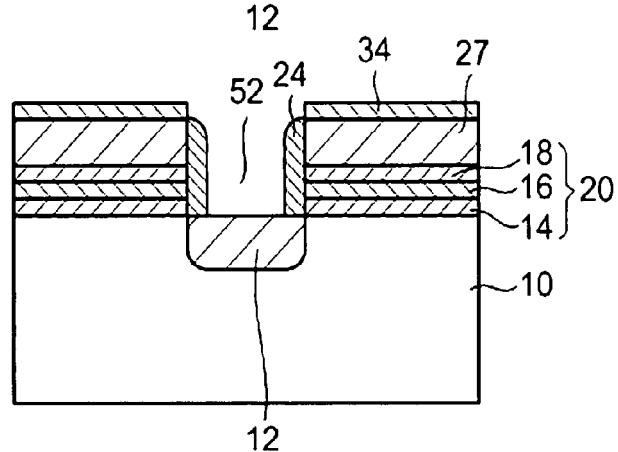

As shown in FIG. 7A, a tunnel oxide film 14 that is a silicon oxide film, a trapping layer 16 that is a silicon nitride film, and a top oxide film 18 that is a silicon oxide film are formed as an ONO film 20 on a semiconductor substrate 10. As shown in FIG. 7B, a first conductive layer 27 that is made of polysilicon and is to be gate electrodes is formed on the ONO film 20. An insulating film 34 that is a silicon nitride film is formed on the first conductive layer 27. As shown in FIG. 7C, a photoresist having openings for forming bit lines is formed on the first conductive layer 27. With the photoresist serving as a mask, etching is performed on the insulating film 34, the first conductive layer 27, and the ONO film 20. As a result, openings 52 for forming bit lines are formed in the insulating film 34, the first conductive layer 27, and the ONO film 20. The openings 52 extend in the direction in which the bit lines should extend. Arsenic ions are then implanted, so as to form the bit lines 12 in the openings 52 in the semiconductor substrate 10. As shown in FIG. 7D, a PSG film is formed, and etching is performed on the PSG film. In this manner, sidewalls 24 are formed on the side faces of the first conductive layer 27, the ONO film 20, and the openings 52.

Figure 8A:
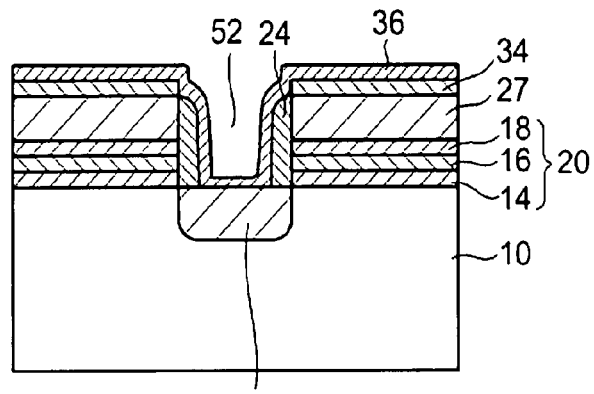
FIGS. 8A through 8D are cross-sectional views also showing procedures for manufacturing the flash memory in accordance with the second embodiment of the present invention.
Figure 8B:
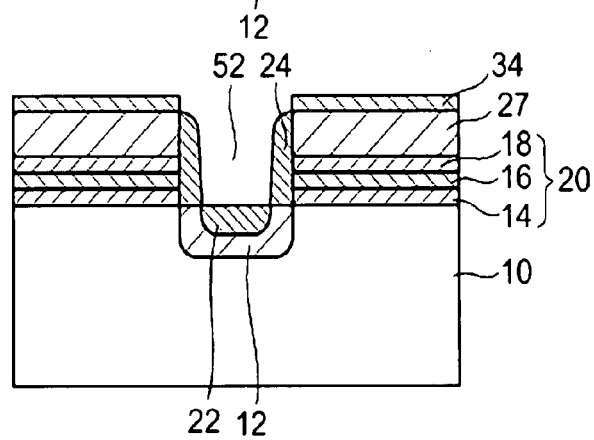
Figure 8C:
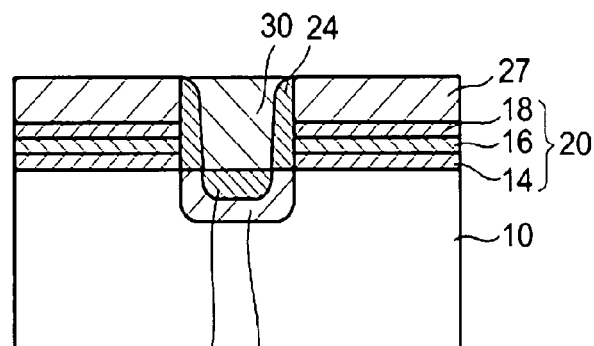
Figure 8D:
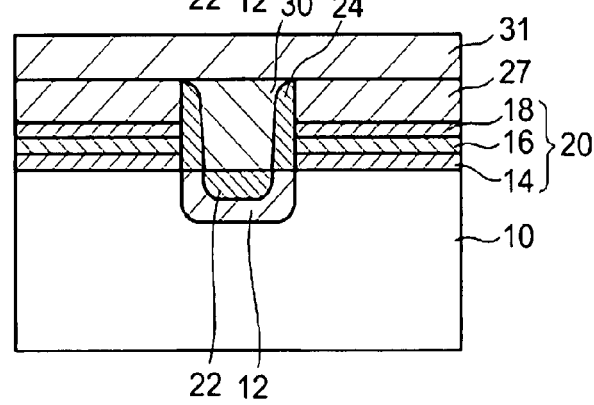

As shown in FIG. 8A, a cobalt (Co) film 36 is formed on the insulating film 34, the sidewalls 24, and the bit lines 12 in the openings 52. As shown in FIG. 8B, a heat treatment is carried out so that the Co film 36 is silicided with the silicon in the bit lines 12, and silicide layers 22 are formed. Since the insulating film 34 and the sidewalls 24 cover the first conductive layer 27 at this point, the first conductive layer 27 is not silicided. As shown in FIG. 8C, an insulating layer 30 made of silicon oxide is formed in the openings 52 and on the insulating film 34 by high-density plasma CVD, for example. The insulating layer 30 is then polished by CMP until reaching the first conductive layer 27. In this manner, the insulating layer 30 remains in the openings 52, and the first conductive layer 27 and the insulating layer 30 are leveled with each other. The insulating film 34 is removed by the polishing, or is removed before the polishing. As shown in FIG. 8D, a second conductive layer 31 made of polysilicon is formed on the first conductive layer 27 and the insulating layer 30.

As shown in FIG. 9A, the portions of the first conductive layer 27 and the second conductive layer 31 that are not located in the regions in which word lines are to be formed are removed by etching. As shown in FIG. 9B, gate electrodes 28 are formed from the first conductive layer 27 on the ONO film 20, and word lines 32 are formed from the second conductive layer 31.

As shown in FIGS. 10A through 10C, an interlayer insulating film 40 made of BPSG is formed on the ONO film 20, the insulating layers 30, and the word lines 32. As shown in FIG. 10A, contact portions 42 that are made of W or the like and connect to the silicide layers 22 are formed in the interlayer insulating film 40.

As shown in FIGS. 11A through 11C, wiring layers 44 connecting to the respective contact portions 42 are formed on the interlayer insulating film 40. A protection film 46 is then formed on the wiring layers 44 and the interlayer insulating film 40. In this manner, a semiconductor device in accordance with the second embodiment is completed.

In accordance with the second embodiment, as shown in FIG. 11B, the word lines 32 that extend in the width direction of the bit lines 12 are formed above the ONO film 20, and the gate electrodes 28 are provided between the ONO film 20 and the word lines 32. The sidewalls 24 are in contact with the side faces of the gate electrodes 28 and the ONO film 20. Accordingly, in the flash memory having a double-layer structure of the gate electrodes 28 and the word lines 32, the resistance of the bit lines 12 can also be lowered, and the charge loss can be reduced.

By the manufacturing method in accordance with the second embodiment, the top oxide film 18 is formed on the trapping layer 16, as shown in FIG. 7A. The openings 52 are formed in the top oxide film 18 and the trapping layer 16, as shown in FIG. 7C. The sidewalls 24 are formed on the side faces of the openings 52 in the top oxide film 18 and the trapping layer 16, as shown in FIG. 7D. In a case where the top oxide film 18 is formed by the thermal oxidation method, for example, after the bit lines 12 and the silicide layers 22 are formed as in the first embodiment shown in FIG. 4A, diffusion of the bit lines 12 and the silicide layers 22 is caused. In accordance with the second embodiment, the top oxide film 18 is formed before the bit lines 12 are formed. Accordingly, diffusion of the bit lines 12 and the silicide layers 22 due to the formation of the top oxide film 18 can be prevented.

Also, the first conductive layer 27 to be the gate electrodes is formed on the top oxide film 18, as shown in FIG. 7B. The openings 52 are formed in the first conductive layer 27, the top oxide film 18, and the trapping layer 16, as shown in FIG. 7C. The sidewalls 24 are formed on the side faces of the openings 52 in the first conductive layer 27, the top oxide film 18, and the trapping layer 16. With this arrangement, the sidewalls 24 cover the side faces of the first conductive layer 27. Accordingly, in the procedures for forming the silicide layers 22 shown in FIGS. 8A and 8B, a metal layer such as a Co layer can be prevented from covering the side faces of the first conductive layer 27. Particularly, in a case where the first conductive layer 27 is made of polysilicon, silicidation of the first conductive layer 27 can be prevented.

Further, the second conductive layer 31 to be the word lines is formed on the first conductive layer 27, as shown in FIG. 8D. The predetermined portions of the second conductive layer 31 and the first conductive layer 27 are removed, so as to form the word lines 32 from the second conductive layer 31 and the gate electrodes 28 from the first conductive layer 27, as shown in FIGS. 9A and 9B. Through those procedures, a flash memory having a double-layer structure of the gate electrodes 28 and the word lines 32 can be produced.

Further, the insulating film 34 is formed on the first conductive layer 27, as shown in FIG. 7B. When the silicide layers 22 are formed, a metal layer such as a Co film 36 is formed on the insulating film 34 and the bit lines 12 in the respective openings 52, as shown in FIG. 8A. The metal layer is silicided through a heat treatment, so as to form the silicide layers 22, as shown in FIG. 8B. In those procedures, the insulating film 34 prevents the metal layer from covering the first conductive layer 27. Particularly, in a case where the first conductive layer 27 is made of polysilicon, silicidation of the first conductive layer 27 can be prevented.

Further, the insulating layers 30 are formed in the respective openings 52, as shown in FIG. 8C. The second conductive layer 31 is formed on the first conductive layers 27 and the insulating layers 30. In this manner, the openings 52 are filled with the insulating layers 30, so that the second conductive layer 31 can be formed on a flatter surface, as shown in FIG. 8D. Furthermore, since the sidewalls 24 are covered with the insulating layers 30, contamination of the trapping layer 16 can be more effectively restrained.

Although a few preferred embodiments of the present invention have been shown and described, it would be appreciated by those skilled in the art that changes may be made in these embodiments without departing from the principles and spirit of the invention, the scope of which is defined in the claims and their equivalents.

Finally, various aspects of the present invention are summarized in the following.

According to a first aspect of the present invention, there is provided A semiconductor device including: a bit line that is provided in a semiconductor substrate; a suicide layer that has side faces and a bottom face surrounded by the bit line, and is provided within the bit line; an ONO film that is provided on the semiconductor substrate; and sidewalls that are in contact with side faces of a trapping layer in the ONO film over portions of the bit line located on both sides of the silicide layer, the sidewalls being formed with silicon oxide films including phosphorus.

In the above-described semiconductor device, the sidewalls may be in contact with side faces of a tunnel oxide film and the trapping layer in the ONO film; and the ONO film may have a top oxide film formed on the trapping layer, the sidewalls, and the silicide layer. The top oxide film restrains contamination of the trapping layer, and the charge loss can be more effectively restrained.

The above-described semiconductor device may further include a word line that extends in a width direction of the bit line and is provided on the ONO film.

The above-described semiconductor device may further include: a word line that extends in a width direction of the bit line and is provided on the ONO film; and a gate electrode that is provided between the ONO film and the word line, and the sidewalls may be in contact with side faces of the gate electrode and the ONO film. The resistance of the bit line can be made lower, and the charge loss can be restrained also in a semiconductor device having a double-layer structure of the gate electrode and the word line.

The above-described semiconductor device may further include: an interlayer insulating film that is provided on the ONO film; and a contact portion that is provided in the interlayer insulating film and connects to the silicide layer. The charge loss caused by the trapping layer contaminated when the interlayer insulating film and the contact portion are formed can be restrained.

According to a second aspect of the present invention, there is provided a method of manufacturing a semiconductor device including: forming a trapping layer on a semiconductor substrate; forming an opening in the trapping layer; forming a bit line in a portion of the opening located within the semiconductor substrate; forming sidewalls on side faces of the opening, the side walls being formed with oxide silicon films including phosphorus; and forming a silicide layer in the bit line, with the sidewalls serving as masks.

The above-described method may further include forming a top oxide film on the trapping layer, the sidewalls, and the silicide layer. The top oxide film restrains contamination of the trapping layer, and the charge loss can be more effective restrained.

The above-described method may further include forming a word line on the top oxide film, the word line extending in a width direction of the bit line.

The above-described method may further include forming a top oxide film on the trapping layer, and forming the opening may include forming the opening in the top oxide film and the trapping layer; and forming the sidewalls may include forming the sidewalls on side faces of the opening formed in the top oxide film and the trapping layer.

The above-described method may further include forming a top oxide film on the trapping layer, and forming the opening may include forming the opening in the top oxide film and the trapping layer; and forming the sidewalls may include forming the sidewalls on side faces of the opening formed in the top oxide film and the trapping layer. The top oxide film is formed before the bit line is formed. Accordingly, diffusion of the bit line and the silicide layer due to the formation of the top oxide film can be prevented.

The above-described method may further include forming a first conductive layer to be a gate electrode on the top oxide film, and forming the opening may include forming the opening in the first conductive layer, the top oxide film, and the trapping layer; and forming the sidewalls may include forming the sidewalls on side faces of the opening formed in the first conductive layer, the top oxide film, and the trapping layer. The side faces of the first conductive layer can be protected by the sidewalls.

The above-described method may further include: forming a second conductive layer to be a word line on the first conductive layer; and forming the word line from the second conductive layer and the gate electrode from the first conductive layer by removing predetermined regions of the second conductive layer and the first conductive layer. The resistance of the bit line can be made lower, and the charge loss can be restrained also in a semiconductor device having a double-layer structure of the gate electrode and the word line.

The above-described method may further include forming an insulating film on the first conductive layer, and forming the silicide layer may include: forming a metal layer on the insulating film and the bit line located in the opening; and siliciding the metal layer through a heat treatment. The insulating film prevents the metal layer from directly covering the first conductive layer. Accordingly, silicidation of the top face of the first conductive layer can be prevented when the metal layer is silicided.

The above-described method may further include forming an insulating layer in the opening, and forming the second conductive layer may include forming the second conductive layer on the first conductive layer and the insulating layer. The insulating layer is formed in the opening, so that the second conductive layer can be formed on a flatter surface.

The above-described method may further include: forming an interlayer insulating film on the trapping layer; and forming a contact portion in the interlayer insulating film, the contact portion connecting to the silicide layer. The charge loss caused by the trapping layer contaminated when the interlayer insulating film and the contact portion can be restrained.

Embodiments generally relate to semiconductor devices. More particularly, embodiments allow for a semiconductor device that has lower leakage current between the semiconductor substrate and the bit lines, so as to reduce the resistance of the bit lines and restrain the charge loss through the trapping layer. In one implementation, the various embodiments are applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive nagivation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones, etc.).

Flash memory stores information in an array of floating gate transistors, called "cells", each of which traditionally stores one bit of information. However, newer flash memory devices, such as MirrorBit® Flash Technology from Spansion Inc., can store more than 1 bit per cell. The MirrorBit cell doubles the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored on the opposite side of the cell.

With regards to wireless markets, flash memory that utilizes MirrorBit® technology has several key advantages. For example, flash memory that utilizes MirrorBit® technology is capable of burst-mode access as fast as 80 MHz, page access times as fast as 25 ns, simultaneous read-write operation for combined code and data storage, and low standby power (e.g., 1 µA).

Figure 12:
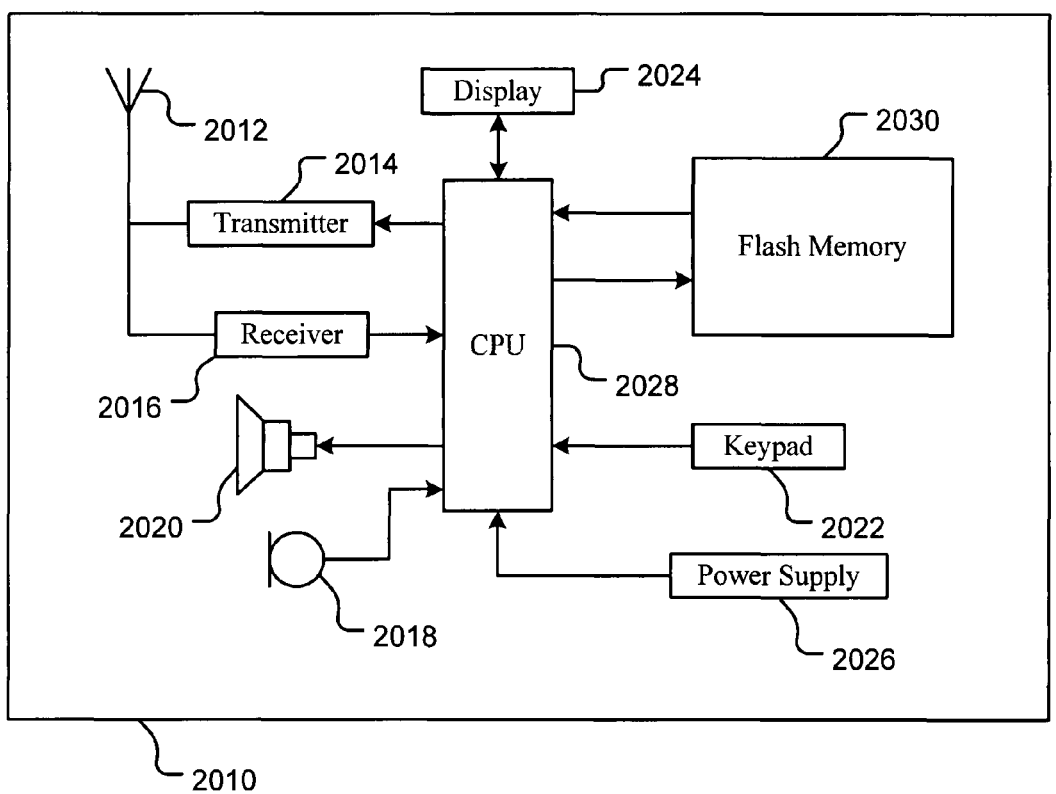
FIG. 12 illustrates a block diagram of a portable phone, upon which embodiments may be implemented.

FIG. 12 shows a block diagram of a conventional portable telephone 2010 (e.g., cell phone, cellular phone, mobile phone, internet protocol phone, wireless phone, etc.), upon which embodiments can be implemented. The cell phone 2010 includes an antenna 2012 coupled to a transmitter 2014 and a receiver 2016, as well as a microphone 2018, a speaker 2020, a keypad 2022, and a display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory 2030 includes a bit line that is provided in a semiconductor substrate, a silicide layer that has side faces and a bottom face surrounded by the bit line, and is provided within the bit line, an ONO film that is provided on the semiconductor substrate, and sidewalls that are in contact with side faces of a trapping layer in the ONO film over portions of the bit line located on both sides of the silicide layer, the sidewalls being formed with silicon oxide films including phosphorus. According to various embodiments, it is possible to provide a semiconductor device, such as flash memory, that has lower leakage current between the semiconductor substrate and the bit lines, so as to reduce the resistance of the bit lines and restrain the charge loss through the trapping layer. The present invention also provides a method of manufacturing such a semiconductor device. As a result, the flash memory 2030 operates much more efficiently that conventional flash memory. This increased efficiency for the flash memory translates into increased efficiency and reliability for various devices, such as mobile phones, cellular phones, internet protocol phones, and/or wireless phones.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are connected to the bit lines in a parallel configuration, while in a conventional NAND-type flash memory, the memory cell transistors are connected to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps.), flash memory requirements have steadily increased. Thus, a more efficient flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

Figure 13:
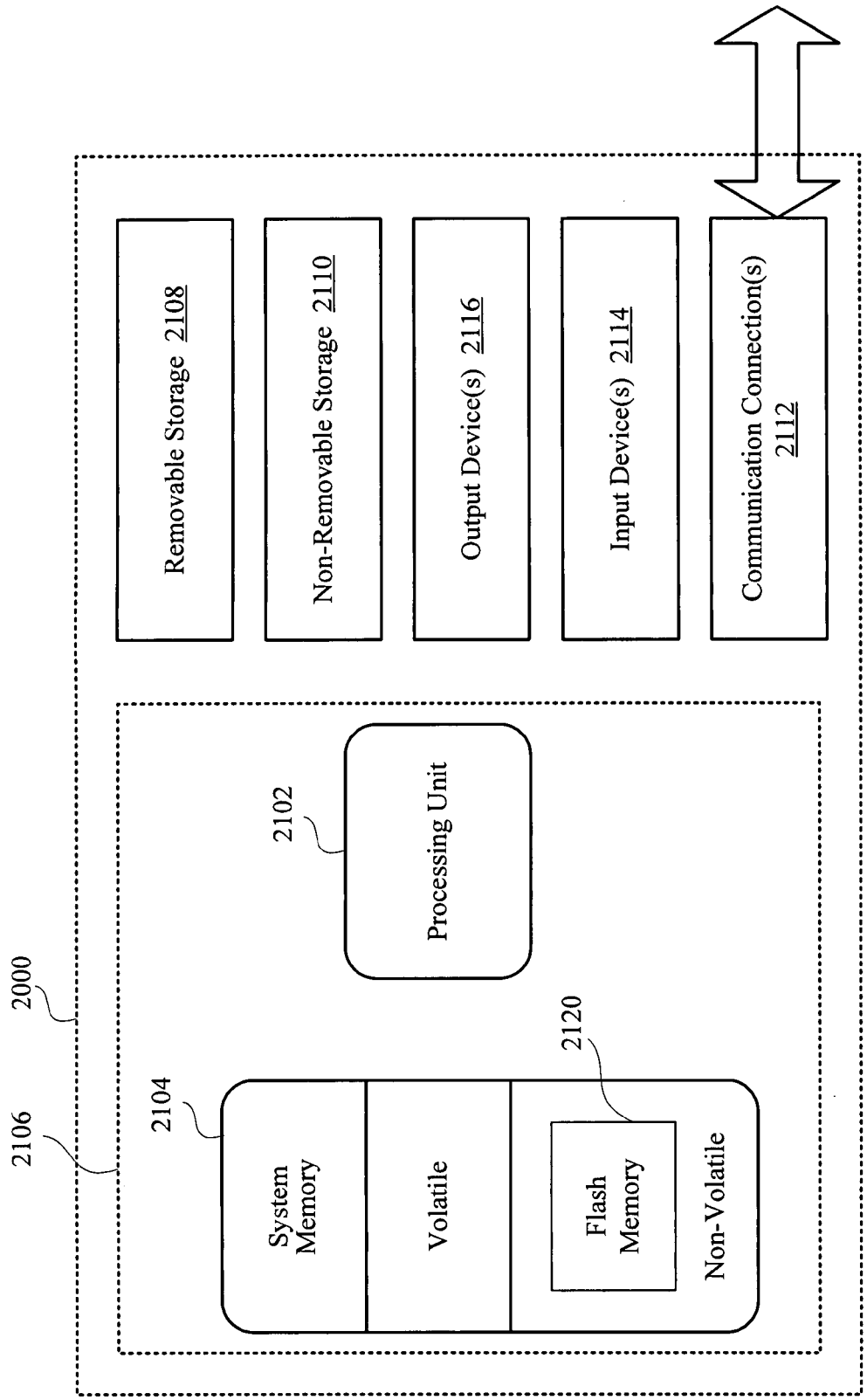
FIG. 13 illustrates a block diagram of a computing device, upon which embodiments may be implemented.

FIG. 13 illustrates a block diagram of a computing device 2100, upon which embodiments of the present invention can be implemented. Although computing device 2100 is shown and described in FIG. 13 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. Similarly, in another example, computing device 2100 can include additional components not shown in FIG. 13.

Also, it is appreciated that the computing device 2100 can be a variety of things. For example, computing device 2100 may be, but is not limited to, a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounter frequent physical impacts. Also, flash memory is more able than other types of memory to withstand intense physical pressure and/or heat. Thus, portable computing devices are able to be used in a greater range of environmental variables.

In its most basic configuration, computing device 2100 typically includes at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 11 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could a game cartridge receiving component utilized to receive different game cartridges. In another example, in the context of a Digital Versatile Disc (DVD) recorder, the removable storage is a DVD receiving component utilized to receive and read DVDs. Such additional storage is illustrated in FIG. 13 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, the flash memory 2120 comprises: a bit line that is provided in a semiconductor substrate, a silicide layer that has side faces and a bottom face surrounded by the bit line, and is provided within the bit line, an ONO film that is provided on the semiconductor substrate, and sidewalls that are in contact with side faces of a trapping layer in the ONO film over portions of the bit line located on both sides of the silicide layer, the sidewalls being formed with silicon oxide films including phosphorus. According to various embodiments, it is possible to provide a semiconductor device, such as flash memory, that has lower leakage current between the semiconductor substrate and the bit lines, so as to reduce the resistance of the bit lines and restrain the charge loss through the trapping layer. The present invention also provides a method of manufacturing such a semiconductor device. As a result, the flash memory 2030 operates much more efficiently that conventional flash memory. This increased efficiency for the flash memory translates into increased efficiency and reliability for various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. Further, in one embodiment, the flash memory 2120 utilizes MirrorBit® technology to allow storing of two physically distinct bits on opposite sides of a memory cell.

Device 2100 may also contain communications connection(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well known in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous. Users would also benefit from reduced memory read time and reduced cost.

Figure 14:
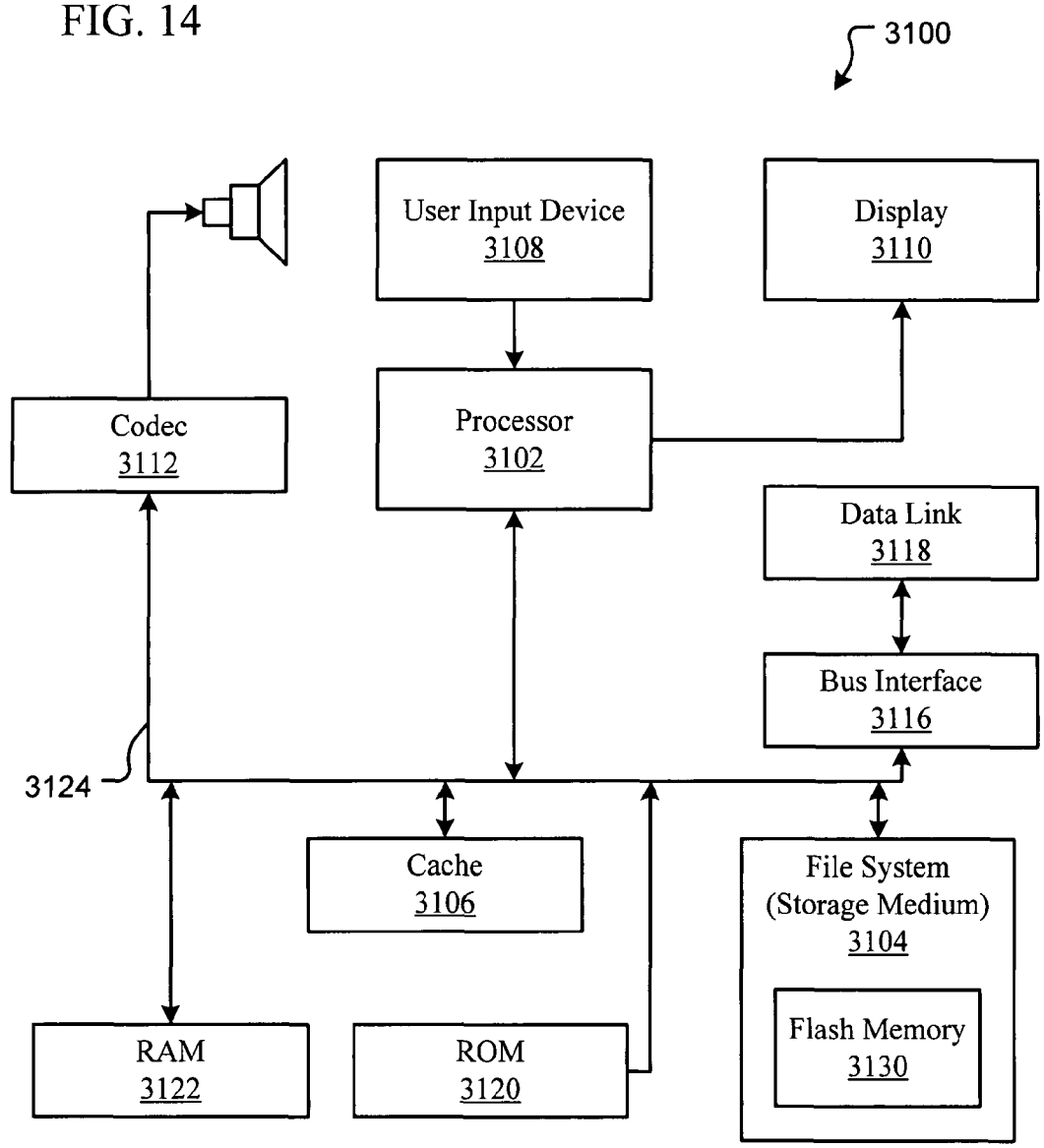
FIG. 14 illustrates an exemplary portable multimedia device, or media player, in accordance with various embodiments of the present invention.

FIG. 14 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage medium or a plurality of storage media, such as disks, memory cells, and the like. The file system 3104 typically provides high capacity storage capability for the media player 3100. Also, file system 3104 includes flash memory 3130. In the present embodiment, the flash memory 3130 comprises: a bit line that is provided in a semiconductor substrate, a silicide layer that has side faces and a bottom face surrounded by the bit line, and is provided within the bit line, an ONO film that is provided on the semiconductor substrate, and sidewalls that are in contact with side faces of a trapping layer in the ONO film over portions of the bit line located on both sides of the silicide layer, the sidewalls being formed with silicon oxide films including phosphorus. According to various embodiments, it is possible to provide a semiconductor device, such as flash memory, that has lower leakage current between the semiconductor substrate and the bit lines, so as to reduce the resistance of the bit lines and restrain the charge loss through the trapping layer. The present invention also provides a method of manufacturing such a semiconductor device. As a result, the flash memory 2030 operates much more efficiently that conventional flash memory. This increased efficiency for the flash memory translates into increased efficiency and reliability for various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3122 and a Read-Only Memory (ROM) 3120. The ROM 3120 can store programs, utilities or processes to be executed in a non-volatile manner. The RAM 3122 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3112. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs, photos, video, etc.) in the file system 3104. When a user desires to have the media player play/display a particular media item, a list of available media assets is displayed on the display 3110. Then, using the user input device 3108, a user can select one of the available media assets. The processor 3102, upon receiving a selection of a particular media item, supplies the media data (e.g., audio file, graphic file, video file, etc.) for the particular media item to a coder/decoder (CODEC) 3110. The CODEC 3110 then produces analog output signals for a speaker 3114 or a display 3110. The speaker 3114 can be a speaker internal to the media player 3100 or external to the media player 3100. For example, headphones or earphones that connect to the media player 3100 would be considered an external speaker.

In a particular embodiment, the available media assets are arranged in a hierarchical manner based upon a selected number and type of groupings appropriate to the available media assets. For example, in the case where the media player 3100 is an MP3-type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

As described above, the present invention provides a semiconductor device that has lower leakage current between the semiconductor substrate and the bit lines, so as to reduce the resistance of the bit lines and restrain the charge loss through the trapping layer, and also provides a method of manufacturing the semiconductor device.

Although a few preferred embodiments of the present invention have been shown and described, it would be appreciated by those skilled in the art that changes may be made in these embodiments without departing from the principles and spirit of the invention, the scope of which is defined in the claims and their equivalents.

The invention claimed is:

1. A semiconductor device, comprising:
   a bit line that is formed in a semiconductor substrate;
   a silicide layer that has side surfaces and a bottom surface that are surrounded by the bit line, and a top surface that is fully covered over a span from a first side surface to a second side surface by a structure that is different from the bit line;
   an ONO film that is formed on the semiconductor substrate; and
   sidewalls that are in contact with side faces of a trapping layer in the ONO film over portions of the bit line located on both sides of the silicide layer, the sidewalls being formed with silicon oxide films wherein said structure is formed of a single material that extends between and contacts said sidewalls wherein the structure is formed of an insulating material that covers the inside portions of the sidewalls that contact the surface of the substrate.

2. The semiconductor device as claimed in claim 1, wherein:
   the sidewalls are in contact with side faces of a tunnel oxide film and the trapping layer in the ONO film; and the ONO film has a top oxide film formed on the trapping layer, the sidewalls, and the silicide layer.

3. The semiconductor device as claimed in claim 1, further comprising a word line that extends in a width direction of the bit line and is provided on the ONO film.

4. The semiconductor device as claimed in claim 1, further comprising:
   a word line that extends in a width direction of the bit line and is provided on the ONO film; and
   a gate electrode that is provided between the ONO film and the word line, wherein the sidewalls are in contact with side faces of the gate electrode and the ONO film.

5. The semiconductor device as claimed in claim 1, farther comprising:
   an interlayer insulating film that is provided on the ONO film; and a contact portion that is provided in the interlayer insulating film and connects to the silicide layer.

6. A wireless communications device, comprising:
   a memory comprising:
      a bit line that is formed in a semiconductor substrate;
      a silicide layer that has side surfaces and a bottom surface that are surrounded by the bit line, and a top surface that is fully covered over a span from a first side surface to a second side surface by a structure that is different from the bit line;
      an ONO film that is formed on the semiconductor substrate; and
      sidewalls that are in contact with side faces of a trapping layer in the ONO film over portions of the bit line located on both sides of the silicide layer, the sidewalls being formed with silicon oxide films wherein said structure is formed of a single material that extends between and contacts said sidewalls wherein the structure is formed of an insulating material that covers the inside portions of the sidewalls that contact the surface of the substrate;
   a processor;
   a communications component;
   a transmitter;
   a receiver; and
   an antenna connected to the transmitter circuit and the receiver circuit.

7. The wireless communications device of claim 6, wherein said flash memory is NAND flash memory.

8. The wireless communications device of claim 6, wherein said flash memory is NOR flash memory.

9. The wireless communications device of claim 6, wherein said flash memory comprises at least one memory cell operable to store more than one bit.

10. A computing device comprising:
    a processor;
    an input component;
    an output component; and
    a memory comprising:
       a bit line that is formed in a semiconductor substrate;
       a silicide layer that has side surfaces and a bottom surface that are surrounded by the bit line, and a top surface that is fully covered over a span from a first side surface to a second side surface by a structure that is different from the bit line;
       an ONO film that is formed on the semiconductor substrate; and
       sidewalls that are in contact with side faces of a trapping layer in the ONO film over portions of the bit line located on both sides of the silicide layer, the sidewalls being formed with silicon oxide films including phosphorus wherein said structure is formed of a single insulating material that extends between and covers the inside of said sidewalls wherein the structure contacts portions of the sidewalls that contact the surface of the substrate.

11. The computing device of claim 10, wherein said computing device is a personal computer (PC).

12. The computing device of claim 10, wherein said computing device is a personal digital assistant (PDA).

13. The computing device of claim 10, wherein said computing device is a gaming system.

14. A portable media player comprising:
    a processor;
    a cache;
    a user input component;
    a coder-decoder component; and
    a memory comprising:
       a bit line that is formed in a semiconductor substrate;
       a silicide layer that has side surfaces and a bottom surface that are surrounded by the bit line, and a top surface that is fully covered over a span from a first side surface to a second side surface by a structure that is different from the bit line;
       an ONO film that is formed on the semiconductor substrate; and
       sidewalls that are in contact with side faces of a trapping layer in the ONO film over portions of the bit line located on both sides of the silicide layer, the sidewalls being formed with silicon oxide films wherein said structure is formed of a single insulating material that extends between and covers the inside of said sidewalls wherein the structure contacts portions of the sidewalls that contact the surface of the substrate.

15. The portable media player of claim 14, wherein said portable media player is a portable music player.

16. The portable media player of claim 14, wherein said portable media player is a portable video player.

* * * * *